US008760630B2

(12) United States Patent
Yamashita et al.

(10) Patent No.: US 8,760,630 B2
(45) Date of Patent: Jun. 24, 2014

(54) EXPOSURE APPARATUS AND METHOD OF MANUFACTURING DEVICE

(75) Inventors: Keiji Yamashita, Utsunomiya (JP); Yasuyuki Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 266 days.

(21) Appl. No.: 13/329,747

(22) Filed: Dec. 19, 2011

(65) Prior Publication Data
US 2012/0170010 A1  Jul. 5, 2012

(30) Foreign Application Priority Data

Jan. 1, 2011 (JP) ................. 2011-000001
Dec. 5, 2011 (JP) ................. 2011-266279

(51) Int. Cl.
*G03B 27/32* (2006.01)
*G03B 27/52* (2006.01)
*G03F 7/20* (2006.01)

(52) U.S. Cl.
CPC ........ *G03F 7/70341* (2013.01); *G03F 7/70716* (2013.01)
USPC .............................................. 355/72; 355/30

(58) Field of Classification Search
CPC .......................... G03F 7/70341; G03F 7/70716
USPC ........................................ 355/30, 53, 72, 77
See application file for complete search history.

(56) References Cited

U.S. PATENT DOCUMENTS

| 2005/0231694 A1 | 10/2005 | Kolesnychenko |
| 2006/0177776 A1 | 8/2006 | Matsunaga |
| 2007/0273856 A1* | 11/2007 | Margeson ........................ 355/53 |
| 2009/0168037 A1 | 7/2009 | Kroonen et al. |
| 2009/0168042 A1 | 7/2009 | Kroonen et al. |
| 2010/0060870 A1* | 3/2010 | Dziomkina et al. ............ 355/30 |
| 2010/0141911 A1 | 6/2010 | Emoto et al. |
| 2010/0283981 A1* | 11/2010 | Van Bokhoven et al. ....... 355/30 |
| 2011/0069289 A1 | 3/2011 | Lafarre et al. |
| 2011/0069297 A1 | 3/2011 | Lafarre et al. |

FOREIGN PATENT DOCUMENTS

| JP | 2005303316 A | 10/2005 |
| JP | 2006186112 A | 7/2006 |
| JP | 2008227452 A | 9/2008 |
| JP | 2009141355 A | 6/2009 |
| JP | 2010140958 A | 6/2010 |
| WO | 99/49504 A | 9/1999 |

OTHER PUBLICATIONS

Japanese Office Action issued in Japanese counterpart application No. JP2011-266279, dated Jan. 21, 2013.

* cited by examiner

*Primary Examiner* — Toan Ton
*Assistant Examiner* — Colin Kreutzer
(74) *Attorney, Agent, or Firm* — Rossi, Kimms & McDowell LLP

(57) ABSTRACT

An exposure apparatus which projects a pattern of an original onto a substrate via a liquid to expose the substrate, includes a substrate stage which holds the substrate and moves, the substrate stage including a peripheral member arranged to surround a region in which the substrate is arranged, the peripheral member having a holding surface which holds the liquid, wherein a trench which traps the liquid is formed in the peripheral member, and the trench is arranged to surround the region in which the substrate is arranged, and includes a bottom portion, an inner-side surface extending from the holding surface toward the bottom portion, and an outer-side surface, the inner-side surface having a slant which increases stepwise or continuously in a direction away from the holding surface, and the outer-side surface is provided with a spattering preventing portion which prevents spattering of the liquid trapped by the trench.

6 Claims, 8 Drawing Sheets

F I G. 13A

| ACCELERATION (G) | AMOUNT OF LIQUID AT WHICH SPATTERING DOES NOT OCCUR (μl) |
|---|---|
| 1 | >500 |
| 1.7 | 205 |
| 2 | 210 |
| 3 | 95 |
| 5 | 80 |

F I G. 13B

| ACCELERATION (G) | AMOUNT OF LIQUID AT WHICH SPATTERING DOES NOT OCCUR (μl) |
|---|---|
| 1 | >500 |
| 1.7 | 475 |
| 2 | 425 |
| 3 | 270 |
| 5 | 215 |

EXPOSURE APPARATUS AND METHOD OF MANUFACTURING DEVICE

BACKGROUND OF THE INVENTION

1. Field of the Invention

The present invention relates to an exposure apparatus and a method of manufacturing a device using the same.

2. Description of the Related Art

An immersion exposure apparatus which exposes a substrate by projecting the pattern of an original onto the substrate via a liquid arranged between the substrate and the final surface of a projection optical system is known (International Publication No. 99/49504). When a stage which holds the substrate moves at high speed, the liquid may spatter to the outside of the stage from a liquid holding surface arranged to surround the substrate, thus contaminating components in the exposure apparatus.

Japanese Patent Laid-Open No. 2005-303316 discloses a substrate table which is provided with a drainage trench arranged to surround the outer peripheral edge of the substrate, and a barrier arranged to surround a sensor almost flush with the upper surface of the substrate. Japanese Patent Laid-Open No. 2006-186112 discloses a surface which defines the outer peripheral portion of a substrate support body and is formed so that the contact angle between the liquid and the surface of this outer peripheral portion reduces outwards from the side of the outer edge portion of the substrate. Japanese Patent Laid-Open No. 2006-186112 also discloses a drain provided in the outer peripheral portion of the substrate support body as a liquid recovery mechanism.

Supposedly, as the substrate stage moves at a higher speed, it becomes more difficult to prevent the liquid from spattering simply by arranging a barrier such as a trench outside the substrate. If, for example, a trench is simply provided in the substrate stage, the liquid may pass through a position above the trench by inertia and spatter from the substrate stage. On the other hand, if a projection is provided on the substrate stage, the liquid may collide against it and spatter as well.

SUMMARY OF THE INVENTION

The present invention provides a technique advantageous in suppressing spattering of a liquid from a substrate stage.

One of the aspect of the present invention provides an exposure apparatus which projects a pattern of an original onto a substrate via a liquid to expose the substrate, the apparatus comprising a substrate stage which holds the substrate and moves, the substrate stage including a peripheral member arranged to surround a region in which the substrate is arranged, the peripheral member having a holding surface which holds the liquid, wherein a trench which traps the liquid is formed in the peripheral member, and the trench is arranged to surround the region in which the substrate is arranged, and includes a bottom portion, an inner-side surface extending from the holding surface toward the bottom portion, and an outer-side surface, the inner-side surface having a slant which increases stepwise or continuously in a direction away from the holding surface, and the outer-side surface is provided with a spattering preventing portion which prevents spattering of the liquid trapped by the trench.

Further features of the present invention will become apparent from the following description of exemplary embodiments with reference to the attached drawings.

BRIEF DESCRIPTION OF THE DRAWINGS

FIGS. 13A and 13B are tables illustrating the experimental results that reveal the effect of the embodiments.

DESCRIPTION OF THE EMBODIMENTS

Figure 1:
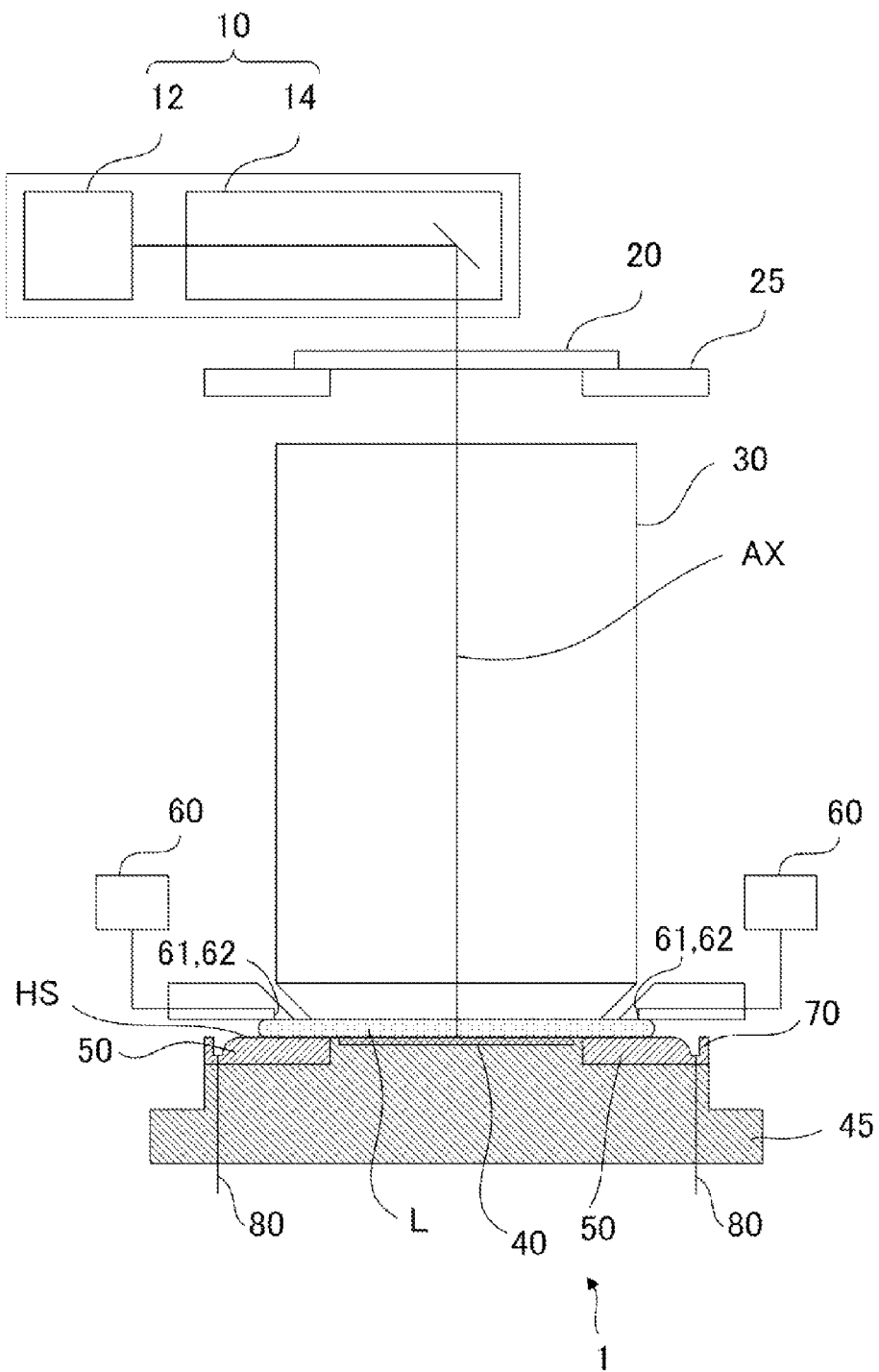
FIG. 1 is a diagram showing the configuration of an exposure apparatus according to an embodiment of the present invention.

Embodiments of the present invention will be described below with reference to the accompanying drawings. Note that the same reference numerals denote the same members throughout the drawings. An exposure apparatus 1 according to an embodiment of the present invention will be described first with reference to FIG. 1. The exposure apparatus 1 is configured as an immersion exposure apparatus. In the exposure apparatus 1, a liquid L is supplied to the gap between a substrate 40 and the surface (final surface), on the side of the substrate 40, of a final optical element 31 of a projection optical system 30. Note that reference symbol AX denotes the optical axis of the final optical element 31. The exposure apparatus 1 projects a pattern formed on an original (also called a reticle) 20 onto the substrate 40 via the projection optical system 30 and liquid L to expose the substrate 40.

The exposure apparatus 1 is suitable for a lithography process on the submicron or quarter-micron order or less. The exposure apparatus 1 exposes a plurality of shot regions on the substrate 40 by the step-and-scan or step-and-repeat scheme. In the step-and-scan scheme, the exposure apparatus 1 transfers the pattern of the original 20 onto the substrate 40 while continuously scanning the substrate 40 with respect to the original 20. After exposure of one shot region is completed, the substrate 40 is moved step by step so that the next shot region is exposed. In the step-and-repeat scheme, each shot region is exposed while the original 20 and the substrate 40 relatively stand still. After exposure of one shot region is completed, the substrate 40 is moved step by step so that the next shot region is exposed. An example in which the exposure apparatus 1 uses a step-and-scan exposure apparatus (also called a "scanner") will be described hereinafter.

The exposure apparatus 1 includes an illumination device 10, an original stage 25 which holds the original 20 and moves, the projection optical system 30, a substrate stage 45 which holds the substrate 40 and moves, and a liquid supply and recovery mechanism 60. Although not shown in FIG. 1, the exposure apparatus 1 also includes an original stage positioning mechanism which positions the original stage 25, and a substrate stage positioning mechanism which positions the substrate stage 45. The original stage positioning mechanism measures the position of the original stage 25 using a measurement device such as a laser interferometer, and positions the original stage 25 using a driving mechanism based on the measurement result. The substrate stage positioning mechanism measures the position of the substrate stage 45 using a measurement device such as a laser interferometer, and positions the substrate stage 45 using a driving mechanism based on the measurement result.

The illumination device 10 is configured to illuminate the original 20 having a circuit pattern formed on it. The illumination device 10 includes, for example, a light source unit 12 and illumination optical system 14. The light source unit 12 can include, for example, an excimer laser such as an ArF excimer laser having a wavelength of about 193 nm or a KrF excimer laser having a wavelength of about 248 nm as a light source. However, the type of light source is not limited to an excimer laser, and an $F_2$ laser having a wavelength of about 157 nm, for example, may be used, and the number of light sources is not limited, either. The light source that can be used for the light source unit 12 is not limited to a laser, either, and one or a plurality of lamps such as mercury lamps or xenon lamps can also be used. When the light source unit 12 uses a laser, a beam shaping optical system is preferably used. The beam shaping optical system uses, for example, a beam expander including a plurality of cylindrical lenses. The beam shaping optical system converts the aspect ratio of the cross-sectional shape of collimated light from the laser into a predetermined value (converts the cross-sectional shape, for example, from a rectangle into a square) to shape the beam shape.

The illumination optical system 14 illuminates the original 20. The illumination optical system 14 includes, for example, a condensing optical system, optical integrator, aperture stop, condenser lens, masking blade, and imaging lens. The illumination optical system 14 can exploit various illumination modes such as conventional illumination, annular illumination, and quadrupole illumination. The condensing optical system is formed by a plurality of optical elements, and efficiently guides light to the optical integrator so that the light is kept in a predetermined shape. The optical integrator uniforms illumination light which illuminates the original 20, and includes, for example, a fly-eye lens, an optical rod, a diffraction grating, and a plurality of sets of cylindrical lens array plates arranged orthogonally to each other. The aperture stop is arranged at a position nearly conjugate to that of an effective light source formed in the pupil of the projection optical system 30, and controls the shape of the effective light source. The condenser lens converges a plurality of light beams, which are emitted by secondary light sources near the exit surface of the optical integrator and transmitted through the aperture stop, and uniformly Kohler-illuminates the masking blade. The masking blade is formed by a plurality of movable light-shielding plates, and has a nearly rectangular, arbitrary aperture shape corresponding to the effective area of the projection optical system 30. The light beam transmitted through the aperture in the masking blade is used as illumination light which illuminates the original 20. The imaging lens projects the aperture shape of the masking blade onto the original 20.

The original 20 is formed by, for example, quartz, has a pattern to be transferred formed on it, and is held by the original stage 25. Light diffracted by the original 20 is projected onto the substrate 40 via the projection optical system 30 and liquid L. The original 20 and substrate 40 are arranged at optically conjugate positions. The exposure apparatus 1 transfers the pattern of the original 20 onto the substrate 40 while scanning them.

The projection optical system 30 can use a catadioptric system including a plurality of lens elements and at least one reflecting mirror, or a dioptric system including only a plurality of lens elements. The projection optical system 30 can include, for example, a planoconvex lens 32 having a given power as the final optical element closest to the substrate (that is, the optical element arranged to be shifted most to the substrate 40). The planoconvex lens 32 has a flat exit surface (the lower surface (the surface on the side of the substrate 40)), and is therefore advantageous in preventing turbulence of the liquid L upon scanning and in preventing mixture of air bubbles in the liquid L due to the turbulence. A protective film may be formed on the exit surface of the planoconvex lens to protect it against the liquid L. Note that the present invention does not limit the final optical element of the projection optical system 30 to the planoconvex lens 32.

The substrate 40 can be, for example, a wafer used to manufacture a semiconductor device, a glass substrate used for manufacturing a display panel, or various other substrates. The substrate 40 is coated with a photoresist.

The substrate stage 45 includes a substrate chuck (not shown), which holds the substrate 40. The substrate stage positioning mechanism which positions the substrate stage 45 preferably has, for example, six degrees of freedom of motion (for example, a total of six degrees of freedom of motion including translational motions parallel to the X-, Y-, and Z-axes which constitute an orthogonal coordinate system, and rotational motions having the X, Y, Z axes as rotation axes). The substrate stage positioning mechanism drives the substrate stage 45 in the X, Y, and Z directions using, for example, a linear motor. The original 20 and substrate 40 are, for example, synchronously scanned, the positions of the original stage 25 and substrate stage 45 are monitored by measurement devices such as laser interferometers, and these two stages are driven at a predetermined speed ratio. The substrate stage 45 can be arranged on, for example, a stage surface plate supported on, for example, the floor via a damper.

The substrate stage 45 includes a peripheral member 50 arranged to surround the region in which the substrate 40 is arranged. The peripheral member 50 has a holding surface HS which holds the liquid L. To start exposure from the edge portion of the substrate 40, the gap below the final surface (lower surface) of the final optical element 31 of the projection optical system 30 must be filled with the liquid L before the edge portion of the substrate 40 reaches the exposure region (the region irradiated with exposure light). Hence, the peripheral member 50 is provided outside the substrate 40 to have the liquid holding surface HS nearly flush with the surface of the substrate 40, thereby making it possible to form a film of the liquid L even in the region that falls outside the substrate 40. The liquid L uses a liquid (substance) which has a high transmittance for the wavelength of exposure light, and is greatly compatible with the resist process. Ultrapure water, pure water, or functional water, for example, is used as the liquid L. Also, part of the peripheral member 50, which surrounds the substrate 40, may be an easily-replaceable, ring-shaped replacement member.

The liquid supply and recovery mechanism 60 has a function of supplying the liquid L to the gap between the substrate 40 or holding surface HS and the final optical element 31 of the projection optical system 30, and recovering the liquid L from this gap. The liquid supply and recovery mechanism 60 can include, for example, a liquid purifier, deaerator, liquid temperature controller. The liquid supply and recovery mechanism 60 supplies the liquid L to the gap between the substrate 40 or holding surface HS and the final optical element 31 of the projection optical system 30 via a supply nozzle 61. Also, the liquid supply and recovery mechanism 60 recovers the liquid L from the gap between the substrate 40 or holding surface HS and the final optical element 31 of the projection optical system 30 via a recovery nozzle 62. In addition to the above-mentioned constituent elements, as a liquid supply mechanism, the liquid supply and recovery mechanism 60 can include, for example, a tank which stores the liquid L, a pressure feeder which feeds the liquid L, and a flow controller which controls the supply flow rate of the liquid L. In addition to the above-mentioned constituent elements, as a liquid recovery mechanism, the liquid supply and recovery mechanism 60 can include, for example, a tank which temporarily stores the recovered liquid L, a suction device which draws the liquid L by suction, and a flow controller for controlling the recovery flow rate of the liquid L.

The supply nozzle 61 and recovery nozzle 62 are preferably formed by a porous material. A porous portion obtained by sintering a fibrous or granular (powdery) metal material or inorganic material, or a material obtained by forming a pinhole or a slit in a plate made of a metal material or inorganic material, is used as the porous material. Stainless steel, nickel, alumina, titanium, or ceramics such as $SiO_2$ or SiC, for example, is used as the metal material or inorganic material.

The liquid purifier reduces, for example, impurities such as metal ions, microparticles, and organic substances contained in a raw material liquid supplied from a liquid supply source (not shown). The deaerator deaerates the liquid L to reduce gases dissolved in the liquid L, such as dissolved oxygen and dissolved nitrogen. The deaerator can be formed by, for example, a film module and vacuum pump. The deaerator is preferably, for example, a device which is provided with a gas-permeable film, supplies the liquid L to its one side, and sets a vacuum on its other side, thereby removing gases dissolved in the liquid L. The temperature controller has a function of controlling the temperature of the liquid L to a target temperature.

Some embodiments of the exposure apparatus 1 including the substrate stage 45 including the peripheral member 50 will be described below.

Figure 2:
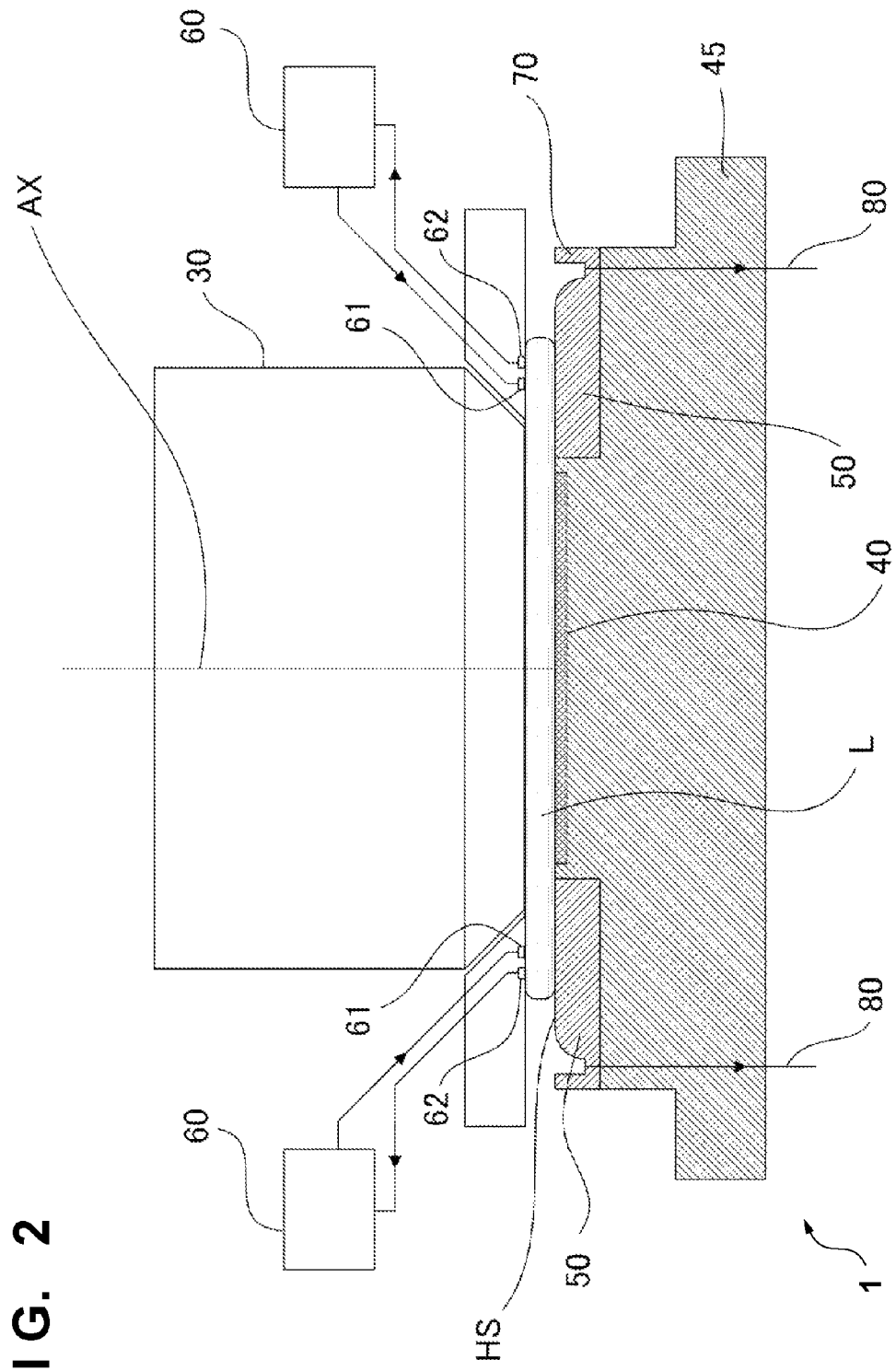
FIG. 2 is a diagram showing the configuration of an exposure apparatus according to the first embodiment.

FIG. 2 is a diagram showing the configuration of the exposure apparatus 1 according to the first embodiment. Note that details which are not shown in FIG. 2 can be the same as those described with reference to FIG. 1.

The exposure apparatus 1 shown in FIG. 2 includes the liquid supply and recovery mechanism 60, which supplies the liquid L to the gap between the substrate 40 or holding surface HS and the final optical element 31 of the projection optical system 30 via the supply nozzle 61. Also, the liquid supply and recovery mechanism 60 recovers, via the recovery nozzle 62, the liquid L supplied to this gap. In this manner, a scheme in which the gap between the substrate 40 and the final optical element 31 of the projection optical system 30 is filled with the liquid L is called the local fill scheme. Ultrapure water can be used as the liquid L.

The surface of the holding surface HS can have the same level as the surface of the substrate 40. Note that "the same level" mentioned herein does not mean exactly "the same level", and means that the level of the holding surface HS is adjusted to the degree that the liquid L can be held on the holding surface HS, similarly on the substrate 40. The holding surface HS is preferably formed by a water-repellent fluorinated material.

Figure 3:
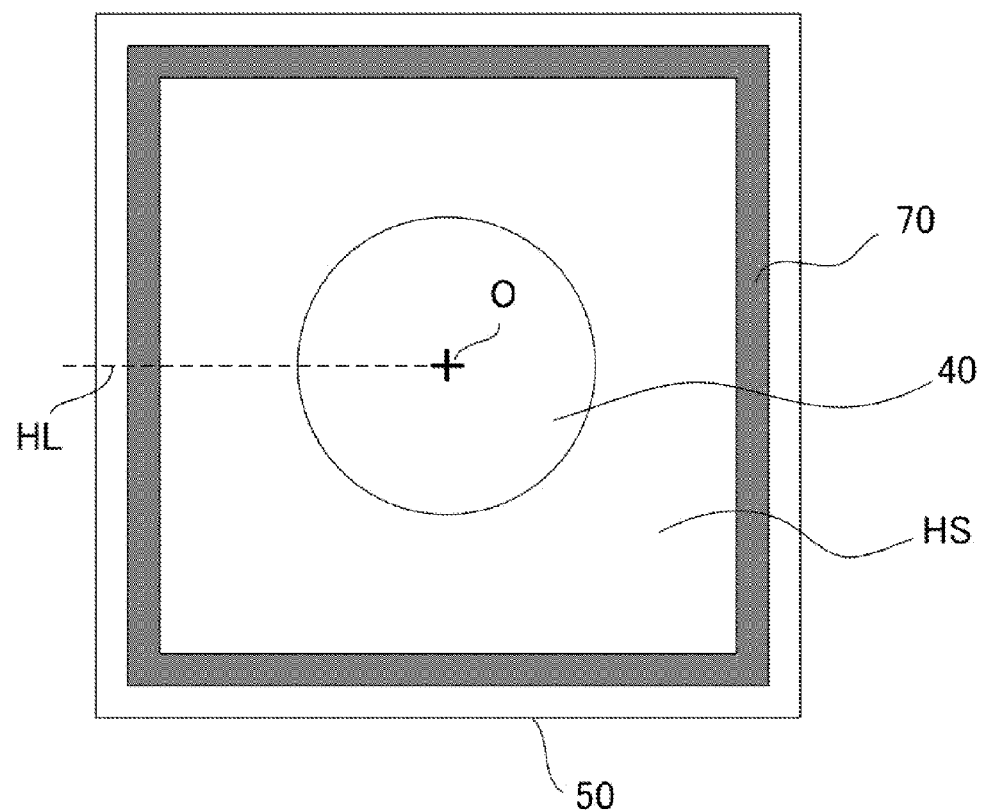
FIG. 3 is a top view showing the configuration of a substrate stage of the exposure apparatus according to the first embodiment.

As illustrated in FIGS. 2 and 3, the peripheral member 50 has a trench 70 arranged to surround the region in which the substrate 40 is arranged, and traps the liquid L by the trench 70. The exposure apparatus 1 can include a discharge portion 80 which discharges, from the trench 70, the liquid L trapped by the trench 70.

Figure 4:
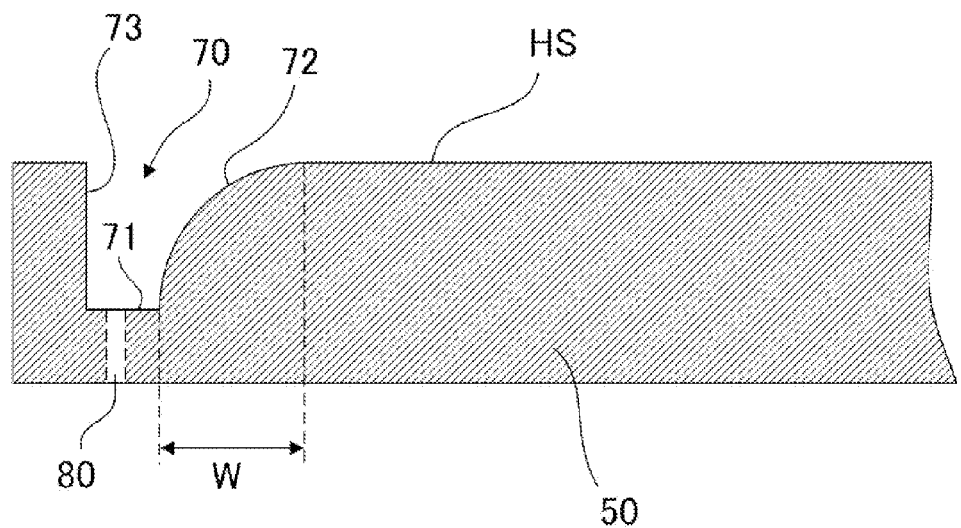
FIG. 4 is a sectional view showing the configuration of the substrate stage of the exposure apparatus according to the first embodiment.

FIG. 4 is an enlarged sectional view illustrating an example of the configuration of the trench 70. The trench 70 includes a bottom portion 71, an inner-side surface 72 extending from the holding surface HS to the bottom portion 71, and an outer-side surface 73. The inner-side surface 72 has a slant which increases stepwise or continuously in a direction away from the holding surface HS. In an example shown in FIG. 4, the inner-side surface 72 has a slant which continuously increases in a direction away from the holding surface HS. The inner-side surface 72 can be a curved surface continuous from the outer edge of the holding surface HS. The inner-side surface 72 can have, for example, an arcuated cross-section.

The contact angle of the liquid L with the inner-side surface 72 is preferably smaller than that of the liquid L with the holding surface HS. Hence, a lyophilic treatment (a hydrophilic treatment when the liquid used is water) can be performed on the inner-side surface 72.

When the inner-side surface defining the trench 70 is defined as a vertical surface, the liquid L relatively moving on the holding surface HS is likely to directly horizontally move and spatter. Note that relative movement of the liquid L includes movement of the substrate stage 45 while the liquid stands still, movement of the liquid while the substrate stage 45 stands still (this occurs when, for example, the liquid L is supplied too much), and movement of both the liquid L and original stage 25. However, by forming the inner-side surface 72 defining the trench 70 as a surface slanted stepwise or continuously in a direction away from the holding surface HS, an effect of drawing the relatively moving liquid L to the inner-side surface 72 can be produced. This effect can further be enhanced by setting the contact angle of the liquid L with the inner-side surface 72 smaller than that of the liquid L with the holding surface HS.

FIGS. 13A and 13B illustrate the result obtained by comparing spattering of the liquid L when the inner-side surface 72 defining the trench 70 is formed as a vertical surface, and when the inner-side surface 72 is formed as an R surface (a surface having an arcuated cross-section) in accordance with this embodiment. FIG. 13A shows the case in which the inner-side surface 72 defining the trench 70 is formed as a vertical surface, and FIG. 13B shows the case in which the inner-side surface 72 defining the trench 70 is formed as an R surface (a surface having an arcuated cross-section).

In this example, the acceleration of the substrate stage 45 was raised in the order of 1 G, 1.7 G, 2 G, 3 G, and 3.5 G until its velocity reached 1,000 mm/sec. Referring to FIGS. 13A and 13B, "Amount of Liquid at Which Spattering Does Not Occur" shows the amount of the liquid L supplied to the substrate stage 45 when the liquid L does not spatter from the substrate stage 45. Note that ">500" shows that the liquid L did not spatter at an amount of 500 µl, but no experiment was conducted for the liquid L for an amount larger than 500 µl. As can be seen from FIGS. 13A and 13B, the effect of trapping the liquid L by the trench is greater in the latter than in the former.

In a configuration example shown in FIG. 4 and those shown in FIGS. 5 to 11 (to be described later), the dimension W of the inner-side surface 72 along a line HL in the plane of a horizontal surface which passes through the center O of the region in which the substrate 40 is arranged is preferably not smaller than 1 mm and is not larger than 30 mm. It was found by the experiment that when the dimension W is smaller than 1 mm, the effect of drawing the liquid L by the inner-side surface 72 is poor. On the other hand, when the dimension W is larger than 30 mm, the size of the substrate stage 45 increases to the degree that it falls outside a tolerance.

Figure 5:
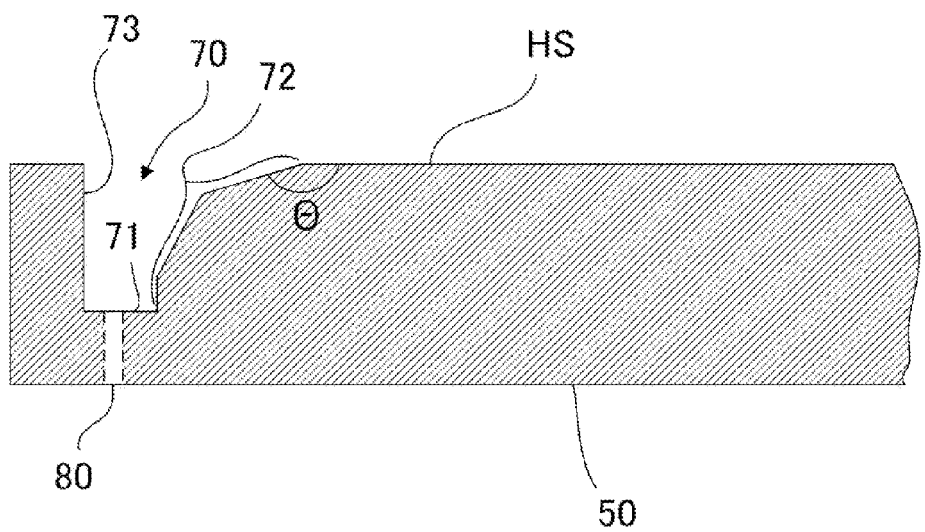
FIG. 5 is a sectional view showing the configuration of the substrate stage of the exposure apparatus according to the first embodiment.

FIG. 5 is an enlarged sectional view showing another example of the configuration of the trench 70. The trench 70 includes a bottom portion 71, an inner-side surface 72 extending from a holding surface HS to the bottom portion 71, and an outer-side surface 73. The inner-side surface 72 has a slant which increases stepwise in a direction away from the holding surface HS. In an example shown in FIG. 5, the inner-side surface 72 has a plurality of slanted surfaces, in which a slanted surface farther from the holding surface HS is slanted more. The internal angle θ that the holding surface HS makes with the portion of the inner-side surface 72, which is in contact with the holding surface HS, is preferably 170° (inclusive) to 135° (inclusive).

A member which forms the whole or part of the bottom portion 71, inner-side surface 72, and outer-side surface 73 that define the trench 70, and a member which forms the whole or part of the holding surface HS may be the same as or different from each other. Also, the peripheral member 50 may be formed by one or a plurality of members.

Figure 6:
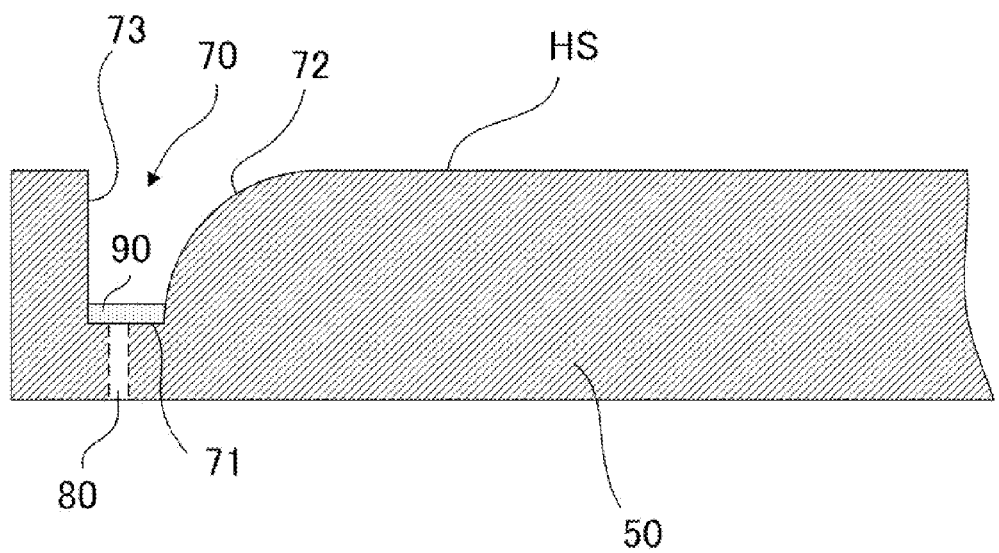
FIG. 6 is a top view showing the configuration of a substrate stage of an exposure apparatus according to the second embodiment.
Figure 7:
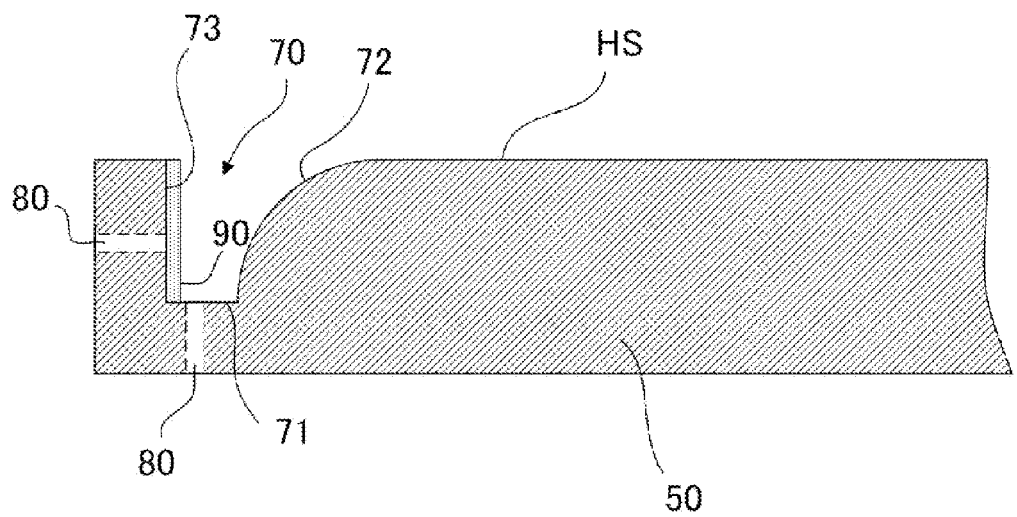
FIG. 7 is a top view showing the configuration of the substrate stage of the exposure apparatus according to the second embodiment.
Figure 8:
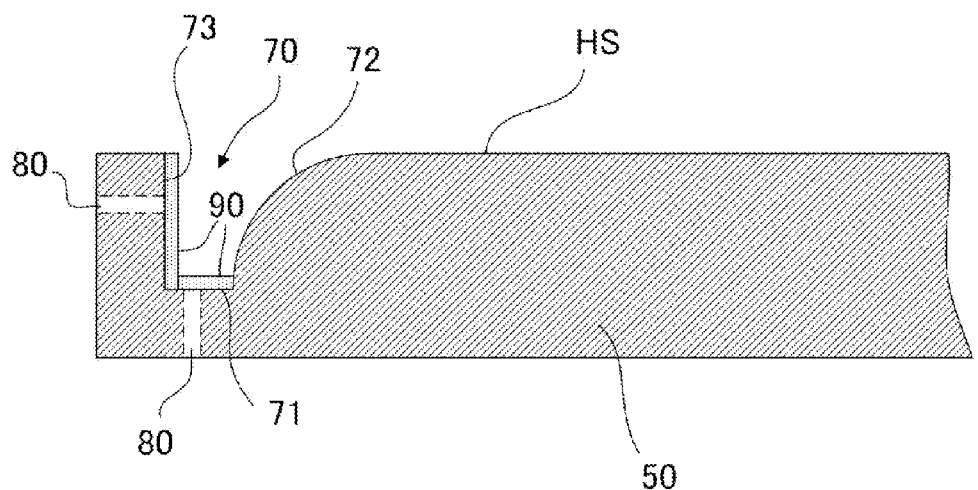
FIG. 8 is a top view showing the configuration of the substrate stage of the exposure apparatus according to the second embodiment.

An exposure apparatus according to the second embodiment will be described below. Details that are not referred to in the second embodiment can be the same as in the first embodiment. In the second embodiment, a peripheral member 50 includes a porous portion on at least one of a bottom portion 71 and outer-side surface 73 defining a trench 70. FIG. 6 illustrates an example in which a porous portion 90 is provided on the bottom portion 71, FIG. 7 illustrates an example in which a porous portion 90 is provided on the outer-side surface 73, and FIG. 8 illustrates an example in which porous portions 90 are provided on both the bottom portion 71 and outer-side surface 73. Upon providing the porous portion 90 on the bottom portion 71 defining the trench 70, a liquid trapped by the bottom portion 71 penetrates through the porous portion 90, and therefore can be prevented from spattering. Upon providing the porous portion 90 on the outer-side surface 73 defining the trench 70, a liquid which collides against the outer-side surface 73 is absorbed by the porous portion 90, and therefore can be prevented from spattering. A discharge portion 80 can be arranged to discharge the liquid absorbed by the porous portion 90. In an example shown in FIG. 8, discharge portions 80 are provided on both the bottom portion 71 and outer-side surface 73.

Figure 9:
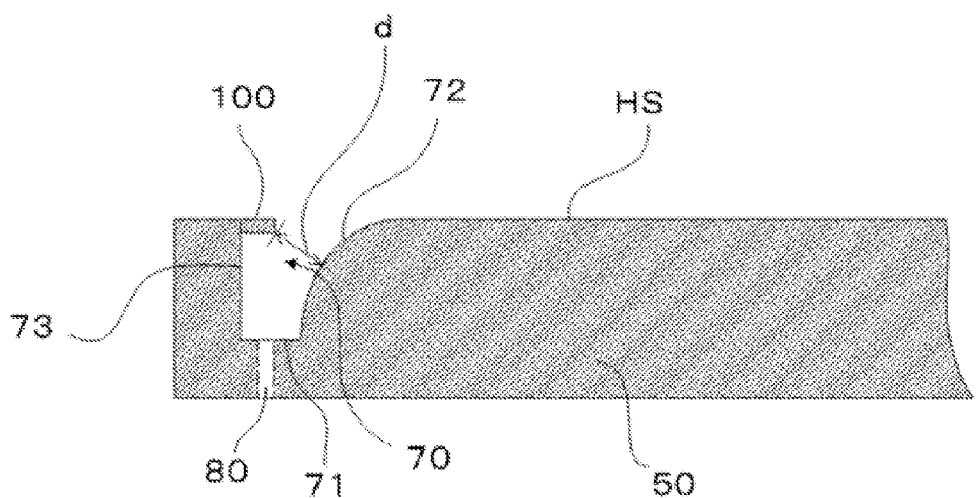
FIG. 9 is a top view showing the configuration of a substrate stage of an exposure apparatus according to the third embodiment.
Figure 10:
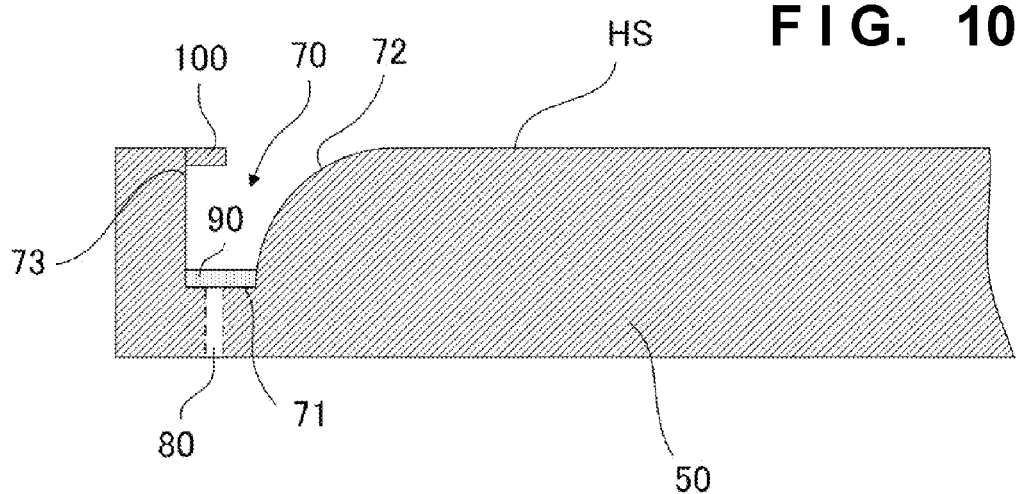
FIG. 10 is a top view showing the configuration of the substrate stage of the exposure apparatus according to the third embodiment.
Figure 11:
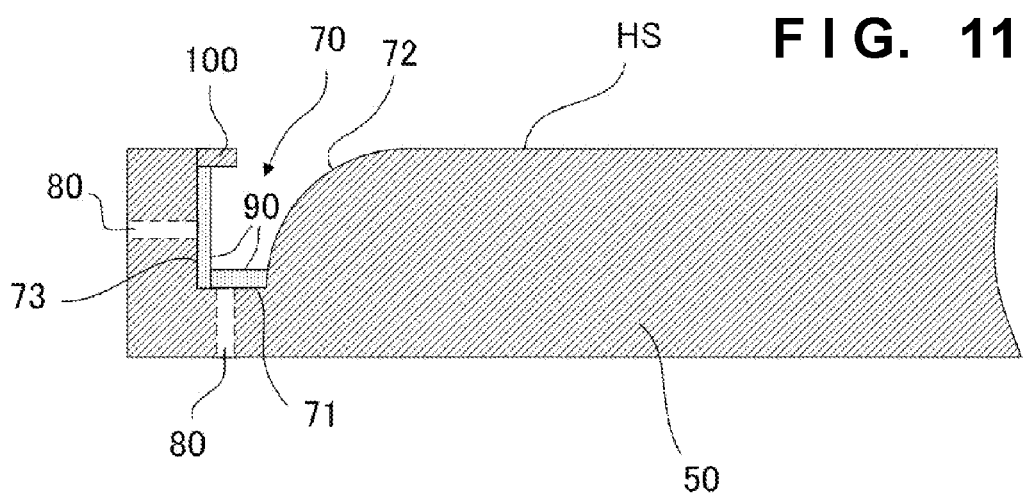
FIG. 11 is a top view showing the configuration of the substrate stage of the exposure apparatus according to the third embodiment.

An exposure apparatus according to the third embodiment will be described below. Details which are not particularly referred to in the third embodiment can be the same as in the first or second embodiment. In the third embodiment, as illustrated in FIGS. 9 to 11, a peripheral member 50 includes a spattering preventing portion 100 which projects from the upper portion of an outer-side surface 73 toward an inner-side surface 72 so as to prevent a liquid trapped by a trench 70 from spattering. As illustrated in FIGS. 10 and 11, the spattering preventing portion 100 may be provided with a porous portion 90 as in the second embodiment. The spattering preventing portion 100 may be integrated with a member which forms the trench 70 or attached to the member. When the liquid L enters the trench 70, it may spatter from the substrate stage 45 upon coming into contact with the end face of the spattering preventing portion 100. Therefore, it is necessary to optimize the distance d between the inner-side surface 72 and the end face of the spattering preventing portion 100. A height h of the liquid L on the inner-side surface 72 is given by:

$$h=(V/(\pi/6\times(3\times\sin^2\alpha/(1-\cos\alpha)^2+1)))^{1/3} \qquad (1)$$

where V is the volume of the liquid L, and α is the contact angle between the liquid L and the inner-side surface 72.

Figure 12:
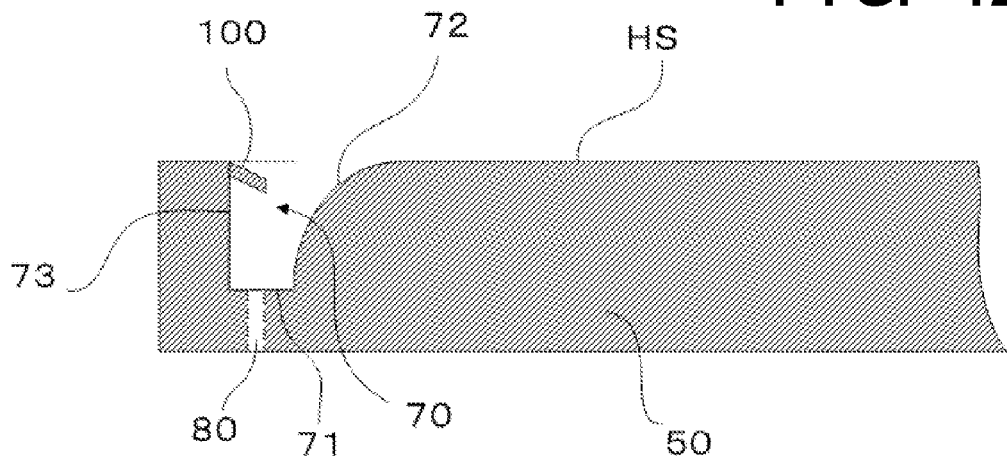
FIG. 12 is a top view showing the configuration of the substrate stage of the exposure apparatus according to the third embodiment.

According to relation (1), when, for example, the contact angle between the liquid L and the inner-side surface 72 is 30°, and the volume of the liquid L is 500 μL, the liquid L has a height of about 3 mm. When the liquid L enters the trench 70, and the distance d between the inner-side surface 72 and the end face of the spattering preventing portion 100 is shorter than the height h of the liquid L, the liquid L comes into contact with the end portion of the spattering preventing portion 100. Hence, the size and angle of arrangement of the spattering preventing portion 100 are determined to satisfy h<d. Also, as illustrated in FIGS. 9 to 11, the spattering preventing portion 100 is arranged horizontally with respect to the holding surface HS. However, as illustrated in FIG. 12, the spattering preventing portion 100 may be tilted downward with respect to the holding surface HS. Tilting the spattering preventing portion 100 downward makes it possible to more reliably prevent contact with the projection optical system. A configuration in which the spattering preventing portion 100 is tilted downward may be provided together with the porous portion 90 in the second embodiment.

The above-described second and third embodiments may be practiced in combination with the inner-side surface 72 slanted stepwise more in a direction away from the holding surface HS, as illustrated in FIG. 5.

A method of manufacturing a device according to a preferred embodiment of the present invention is suitable for manufacturing a device such as a semiconductor device or a liquid crystal device. This method can include a step of exposing a substrate coated with a photosensitive agent using the above-mentioned exposure apparatus 1, and a step of developing the exposed substrate. This method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-000001, filed Jan. 1, 2011 and 2011-266279, filed Dec. 5, 2011, which are hereby incorporated by reference herein in their entirety.

What is claimed is:

1. An exposure apparatus which projects a pattern of an original onto a substrate via a liquid to expose the substrate, the apparatus comprising:
a substrate stage which holds the substrate and moves, the substrate stage including a peripheral member arranged to surround a region in which the substrate is arranged, the peripheral member having a holding surface which holds the liquid, wherein a trench which traps the liquid is formed in the peripheral member, and the trench is arranged to surround the region in which the substrate is arranged, and includes a bottom portion, an inner-side surface extending from the holding surface toward the bottom portion, and an outer-side surface, the inner-side surface having a slant which increases stepwise or continuously in a direction away from the holding surface, and wherein the outer-side surface is provided with a spattering preventing portion which prevents spattering of the liquid trapped by the trench, the spattering preventing portion including a member which extends inwards from the outer-side surface, the member having a slant which approaches the bottom portion with distance from the outer-side surface.

2. The apparatus according to claim 1, wherein a contact angle of the liquid with the inner-side surface is smaller than a contact angle of the liquid with the holding surface.

3. The apparatus according to claim 1, wherein a porous portion is arranged on at least one of the bottom portion and the outer-side surface.

4. The apparatus according to claim 1, further comprising a discharge portion which discharges the liquid trapped by the trench.

5. The apparatus according to claim 1, wherein a dimension of the inner-side surface along a line which falls within a plane of a horizontal surface and passes through the center of the region in which the substrate is arranged is not smaller than 1 mm and is not larger than 30 mm.

6. A method of manufacturing a device, the method comprising the steps of:
 exposing a substrate using an exposure apparatus; and
 developing the substrate,
 wherein the exposure apparatus is configured to project a pattern of an original onto a substrate via a liquid to expose the substrate, the apparatus comprising a substrate stage which holds the substrate and moves, the substrate stage including a peripheral member arranged to surround a region in which the substrate is arranged, the peripheral member having a holding surface which holds the liquid,
wherein a trench which traps the liquid is formed in the peripheral member, and the trench is arranged to surround the region in which the substrate is arranged, and includes a bottom portion, an inner-side surface extending from the holding surface toward the bottom portion, and an outer-side surface, the inner-side surface having a slant which increases stepwise or continuously in a direction away from the holding surface, and the outer-side surface is provided with a spattering preventing portion which prevents spattering of the liquid trapped by the trench, the spattering preventing portion including a member which extends inwards from the outer-side surface, the member having a slant which approaches the bottom portion with distance from the outer-side surface.

* * * * *